(12) United States Patent   (10) Patent No.: US 8,212,535 B2
Minkner et al.   (45) Date of Patent: Jul. 3, 2012

(54) TOROIDAL CORE CURRENT TRANSFORMER WITH PHASE COMPENSATION CIRCUIT

(75) Inventors: Ruthard Minkner, Pfeffingen (CH); Joachim Schmid, Efringen-Kirchen (DE); Rolf Fluri, Basel (CH)

(73) Assignee: Trench France SAS, Saint Louis Cedex (FR)

( * ) Notice: Subject to any disclaimer, the term of this patent is extended or adjusted under 35 U.S.C. 154(b) by 1351 days.

(21) Appl. No.: 11/884,741

(22) PCT Filed: Feb. 17, 2006

(86) PCT No.: PCT/CH2006/000105
§ 371 (c)(1),
(2), (4) Date: Aug. 21, 2007

(87) PCT Pub. No.: WO2006/089443
PCT Pub. Date: Aug. 31, 2006

(65) Prior Publication Data
US 2010/0219799 A1  Sep. 2, 2010

(30) Foreign Application Priority Data

Feb. 22, 2005 (CH) .................................. 306/05

(51) Int. Cl.
G05F 5/00 (2006.01)
G05F 1/00 (2006.01)
H02J 3/08 (2006.01)
(52) U.S. Cl. ........................................ 323/212; 323/218
(58) Field of Classification Search .................. 323/212, 323/215, 218; 324/547
See application file for complete search history.

(56) References Cited

U.S. PATENT DOCUMENTS

| | | | | |
|---|---|---|---|---|
| 3,546,565 A | * | 12/1970 | Koll et al. | 323/309 |
| 3,815,012 A | * | 6/1974 | Milkovic | 323/357 |
| 3,885,213 A | * | 5/1975 | Rioux et al. | 324/127 |
| 4,150,411 A | * | 4/1979 | Howell | 361/45 |
| 4,198,595 A | * | 4/1980 | Milkovic | 323/357 |
| 4,739,515 A | * | 4/1988 | Herzog | 324/645 |
| 4,758,774 A | * | 7/1988 | Crawford et al. | 324/726 |
| 5,542,284 A | * | 8/1996 | Layzell et al. | 73/23.2 |

(Continued)

OTHER PUBLICATIONS

International Search Report, PCT/CH2006/000105, mailed from the European Patent Office on May 26, 2006 (6 pgs.).

(Continued)

Primary Examiner — Jue Zhang
(74) Attorney, Agent, or Firm — K&L Gates LLP

(57) ABSTRACT

Disclosed is a toroidal core current transformer comprising a primary conductor which penetrates the toroidal core and a secondary winding that is wound around the toroidal core. A measuring shunt ($R_{Sh}$) or a load ($Z_b$) is provided at the secondary end. In order to compensate the phase error (f) between the primary current ($I_p$) and the secondary current ($I_s$), a compensation circuit (K) whose capacity (C) is measured substantially according to equation (I) or (II) is provided at the secondary end. In equation (I) or (II), C represents the capacity of the compensation circuit, ω represents the radian frequency, φ represents the phase error between the primary current and the secondary current, $R_{sh}$ represents the resistance of an optional measuring shunt, and $Z_b$ represents the impedance of an optional load.

$$C = \frac{|\tan\phi|}{\omega \cdot R_{sh}} \quad \text{(I)}$$

$$C = \frac{|\tan\varphi|}{\omega \cdot |Z|} \quad \text{(II)}$$

7 Claims, 2 Drawing Sheets

U.S. PATENT DOCUMENTS

| | | | |
|---|---|---|---|
| 6,094,044 | A | 7/2000 | Kustera et al. |
| 6,670,799 | B1 | 12/2003 | Bull et al. |
| 6,954,060 | B1 * | 10/2005 | Edel .............................. 324/547 |
| 2003/0210123 | A1 * | 11/2003 | Chu .............................. 336/229 |
| 2004/0130329 | A1 * | 7/2004 | Suss et al. .................... 324/547 |
| 2005/0212506 | A1 * | 9/2005 | Khalin et al. ................. 324/127 |

OTHER PUBLICATIONS

Preliminary Report on Patentability, PCT/CH2006/000105, mailed from the International Bureau of WIPO on May 10, 2007 (9 pgs.).

Metering International, "Novel Magnetic Materials Increase Performance of Current Transformers for Electonic Watt-Hour Meters," Jan. 1, 2002, http://www.metering.com/vac.

Minkner, "Development Trends in Medium and High Voltage Technologies for Measuring Systems, Filters and Bushings" Conference Proceedings, 2005, IEEE, St. Petersbourg Power Tech, Jun. 27-30, 2005 (on CD).

Minkner, "Universeller Ringkern-Stromwandler für Mess- und Schutzzwecke," ETZ 124(22): 22-29 (2003).

* cited by examiner

TOROIDAL CORE CURRENT TRANSFORMER WITH PHASE COMPENSATION CIRCUIT

CROSS-REFERENCE TO RELATED APPLICATIONS

This application is the national phase of International (PCT) Patent Application Serial No. PCT/CH2006/000105, filed Feb. 17, 2006, published under PCT Article 21(2) in German, which claims priority to and the benefit of Swiss Patent Application No. 306/05, filed Feb. 22, 2005, the disclosures of which are incorporated herein by reference.

The invention relates to a toroidal core current transformer according to the preamble of the independent device claim, as well as to a method for determining the primary current with the aid of a toroidal core current transformer according to the preamble of the independent method claim.

Toroidal core current transformers of this type can be used for transforming a high primary current in a primary conductor by means of a toroidal core into a several times lower secondary current in a secondary winding extending around the toroidal core. Until now, such toroidal core current transformers were used, for example, for billing applications, as well as for protective purposes, wherein different types of current transformers (voltage output, current output) are used for billing applications and for protective purposes.

Toroidal core current transformers with current output are nowadays usually designed in accordance with standards IEC 60044-1 and IEC 60044-6, wherein the load impedance (burden) can only vary within a narrow prescribed band according to these standards (the load impedance is more or less constant). Toroidal core current transformers with current output, but variable burden represent the state of the art with respect to the nowadays used current measuring systems.

The aforementioned toroidal core current transformers are also used with voltage output on the secondary side, namely in accordance with standard IEC 60044-8. One example of such a toroidal core current transformer with voltage output is known from WO-A-98/58267. In the described toroidal core current transformer, the relation $$I_P = \frac{U_S}{\ddot{u} \cdot R_{Sh}}$$

applies to the primary current, wherein $I_P$ represents the primary current and $U_S$ represents the voltage at the measuring shunt $R_{Sh}$.

However, a complex transfer ratio error occurs in both types of toroidal core current transformers (voltage output, current output) due to the losses in the toroidal core (iron loss) and the required magnetizing current of the toroidal core, wherein this complex transfer ratio error is defined by the quantitative error $$|\varepsilon| = \frac{\frac{|I_S|}{\ddot{u}} - |I_P|}{|I_P|} \cdot 100\%$$

and the phase error $$\phi = \phi_P - \phi_S$$

wherein $I_P$ and $I_S$ represent complex primary and secondary currents that are defined by their amounts $|I_P|$ and $|I_S|$ and the corresponding phase angles $\phi_P$ and $\phi_S$.

Errors are created in the determination of the primary current due to the phase error such that even slight phase errors can have quite noticeable consequences with respect to the costs, e.g., in the determination of the power obtained from the electric power grid for energy-intensive operations. An objective of the invention is therefore to propose a toroidal core current transformer, in which this phase error is either completely or quasi completely compensated. It would also be desirable if the current transformer could be operated as a universal current transformer, namely with voltage output according to IEC 60044-8 or with current output at a quasi constant burden according to IEC 60044-1 and IEC 60044-6, respectively.

The invention proposes a toroidal core current transformer according to the features of the independent device claim. Advantageous additional developments of the inventive toroidal core current transformer are defined by the features of the dependent device claims.

The invention relates, in particular, to a toroidal core current transformer, for example for medium high-voltage and high-voltage systems. It comprises a primary conductor that traverses the toroidal core, as well as a secondary winding that is wound around the toroidal core. A measuring shunt or a burden is provided on the secondary side. In order to compensate the phase error between the primary current and the secondary current, a compensation circuit is provided on the secondary side, wherein the capacitance of this compensation circuit is essentially rated in accordance with the equation $$C = \frac{|\tan\varphi|}{\omega \cdot R_{Sh}} \text{ or } C = \frac{|\tan\varphi|}{\omega \cdot |Z_b|},$$

respectively,
wherein
C represents the capacitance of the compensation circuit,
ω represents the radian frequency,
φ represents the phase error between the primary and the secondary current,
$R_{Sh}$ represents the resistance of an optional measuring shunt and
$Z_b$ represents the impedance of an optional burden.

Such a toroidal core current transformer makes it possible to compensate the phase error to well below 1° as described in greater detail below, i.e., the phase error can be completely or almost completely compensated in this fashion.

In one embodiment of the inventive toroidal core current transformer, the capacitance of the compensation circuit is formed by the sum of the capacitance of a cable and an add-on capacitance (e.g., in the toroidal core current transformer with current output).

In one preferred embodiment of the inventive toroidal core current transformer, the compensation circuit comprises two capacitors that are connected in series with opposite polarization, preferably tantalum capacitors (dry electrolyte capacitors), wherein wet electrolyte capacitors may also be used, however, depending on the occurring maximum voltage. Capacitors of this type with the same capacitance have a significantly smaller volume than conventional metallized paper/foil capacitors such that they can be much more easily accommodated in a housing and are also more cost-efficient.

According to one additional development of this embodiment of the inventive toroidal core current transformer, a protective diode is connected in parallel to each of the two capacitors that are connected in series with opposite polarization. The polarization of the protective diodes respectively opposes the polarization of the corresponding capacitor. The protective diodes serve—as their name implies'for protecting the capacitors from incorrect polarity because capacitors of this type are only able to withstand a comparatively low voltage of incorrect polarity. The conducting-state voltage of the diodes therefore needs to be chosen lower than the maximum voltage of incorrect polarity, to which the capacitors can be subjected.

In order to protect the toroidal core current transformer from overvoltages, specifically its components on the secondary side, particularly the electrolyte capacitors, the compensation circuit according to another embodiment comprises a varistor (variable resistor; a ZnO-arrester that represents a short-circuit when a certain voltage is exceeded). In the above-described embodiment with the capacitors that are connected in series with opposite polarization, the varistor is connected, for example, parallel to the series circuit of both capacitors (and—if applicable—to the protective diodes). The varistor therefore protects the capacitors from being destroyed in case of an overvoltage.

According to another embodiment of the inventive toroidal core current transformer, the toroidal core comprises one (or more) air gap(s). The air gap serves for linearizing the magnetizing curve of the toroidal core, but also lowers the inductance of the current transformer and therefore increases the phase error between the primary and the secondary current.

Another aspect of the invention relates to a corresponding method for determining the primary current in accordance with the features of the independent method claim. Advantageous variations of the inventive method are defined by the features of the dependent method claims.

The invention specifically relates to a method for compensating the phase error between the primary current and the secondary current of a toroidal core current transformer, particularly for medium high-voltage and high-voltage systems. The toroidal core current transformer comprises a primary conductor that traverses the toroidal core, as well as a secondary winding that is wound around the toroidal core and a measuring shunt or a burden provided on the secondary side. A compensation circuit is provided on the secondary side in order to compensate the phase error, wherein the capacitance of said compensation circuit is essentially rated in accordance with the equation $$C = \frac{|\tan\varphi|}{\omega \cdot R_{Sh}} \text{ or } C = \frac{|\tan\varphi|}{\omega \cdot |Z_b|},$$

respectively,
wherein
C represents the capacitance of the compensation circuit,
$\omega$ represents the radian frequency,
$\varphi$ represents the phase error between the primary and the secondary current,
$R_{Sh}$ represents the resistance of an optional measuring shunt and
$Z_b$ represents the impedance of an optional burden.

The advantages of this method and its variations described hereinafter respectively correspond to the advantages that were already mentioned above in connection with the description of the corresponding toroidal core transformer, as well as its embodiments and additional developments, respectively.

In one variation of this method, the capacitance of the compensation circuit is formed by the sum of the capacitance of a cable and an add-on capacitance (e.g., in toroidal core current transformers with current output). The cable capacitance is subtracted from the (overall) capacitance of the compensation circuit in order to determine the required add-on capacitance.

In one variation of the inventive method, a compensation circuit with two capacitors that are connected in series with opposite polarization can be used, wherein the capacitors are preferably realized in the form of tantalum capacitors although wet electrolyte capacitor's may also be considered—depending on the required electric strength.

According to an additional development of this variation, it is also possible, in particular, to use a compensation circuit in which a protective diode is connected in parallel to each of the two capacitors that are connected in series with opposite polarization, wherein the polarization of the protective diodes respectively opposes the polarization of the corresponding capacitor.

In another variation of the inventive method, a compensation circuit with a varistor can be used as protection against overvoltages. In another variation of the method, it is possible to use a toroidal core with one or more air gaps.

As already mentioned above, the advantages of the respective variations of the method correspond to the advantages mentioned above in the description of the corresponding embodiments of the toroidal core transformer.

Other advantageous aspects of the invention result from the following description of an advantageous embodiment with the aid of the drawings. In these schematic drawings.

Figure 1:
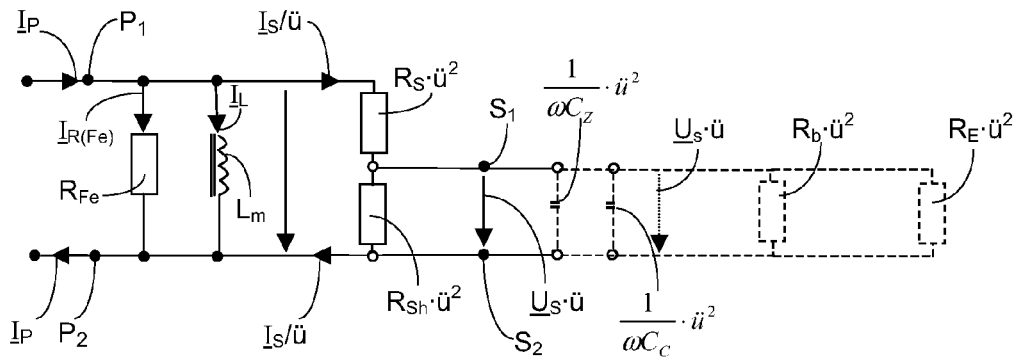
FIG. 1 shows the equivalent circuit diagram of the primary side of an embodiment of the inventive toroidal core current transformer in order to elucidate the compensation principle.

In the equivalent circuit diagram of the primary side of an embodiment of the inventive toroidal core current transformer that is illustrated in FIG. 1, $R_{Fe}$ represents the equivalent linear resistance for the iron losses and $L_m$ represents the inductance of the current transformer. The resistance of the secondary winding is identified by the reference symbol $R_S$, and the measuring shunt is identified by the reference symbol $R_{Sh}$. In this case, the measuring shunt $R_{Sh}$ may be realized as part of the secondary winding as described in WO-A-98/58267. Since the equivalent circuit diagram shown in FIG. 1 refers to the primary side, the factor $ü^2$ is respectively allocated to these resistances, i.e., the square of the transfer ratio $ü$ that results from the quotient of the number of windings $N_P$ of the primary conductor and the number of windings $N_S$ of the secondary winding. This figure also shows the capacitance $C_Z$ of the add-on capacitor and the cable capacitance $C_C$ of the lines. In the example shown, a purely ohmic burden is indicated with the resistance $R_b$ (the basically complex impedance $Z_b$ of the burden only has a real component $R_b$ in this case and therefore is an ohmic resistance) at the secondary connections $S_1$ and $S_2$. The value of the impedances of the add-on capacitors amounts to $$\frac{1}{\omega C_Z} \cdot \ddot{u}^2$$

and that of the cable amounts to $$\frac{1}{\omega C_C} \cdot \ddot{u}^2.$$

The factor $\ddot{u}^2$ is also allocated to these impedances—analogous to the ohmic resistance $R_b$ of the burden—because the equivalent circuit diagram refers to the primary side and the impedances were transformed from the secondary side to the primary side. The overall capacitance C results from the sum of the capacitances $C_Z$ and $C_C$ and therefore amounts to $C=C_Z+C_C$. The voltage at the secondary connections $S_1$ and $S_2$ amounts to $U_S \cdot \ddot{u}$ because the voltage $U_S$ on the secondary side needs to be multiplied with the transfer ratio $\ddot{u}$ during to transformation to the primary side. $R_E$ identifies the input resistance of the connected billing meters, control and/or protective devices, wherein the factor $\ddot{u}^2$ is also allocated to this input resistance because the equivalent circuit diagram refers to the primary side.

The primary current $I_P$ flows through the primary connections $P_1$ and $P_2$. This primary current $I_P$ is divided into the partial currents $I_{P(Fe)}$ and $I_L$, as well as the partial current $I_S/\ddot{u}$ because the secondary current $I_S$ needs to be divided by the transfer ratio $\ddot{u}$ (see above) due to the transformation to the primary side.

Depending on the type of current transformer (voltage output, current output), the measuring shunt $R_{Sh}$ or the burden $R_b$ may be provided in FIG. 1. Under the respective prerequisites $R_E \gg R_{Sh}$ or $R_E \gg R_b$, the correlation between the primary current $I_P$ and the voltage $U_S$ at the secondary connections $S_1$ and $S_2$ (or on the measuring shunt $R_{Sh}$ in this case, respectively) in accordance with the following equation results from the equivalent circuit diagram (FIG. 1):

$$\frac{I_P}{\ddot{u} \cdot \underline{U}_S} = \frac{1}{\ddot{u}^2 \cdot R_{Sh}} + \frac{1}{R_{Fe}} \cdot \left(1 + \frac{R_S}{R_{Sh}}\right) + \qquad [1]$$

$$\frac{R_S \cdot C}{L_m} - j\frac{1}{\omega L_m} \cdot \left(1 + \frac{R_S}{R_{Sh}}\right) + j\omega C \cdot \left(\frac{1}{\ddot{u}^2} + \frac{R_S}{R_{Fe}}\right)$$

Figure 2:
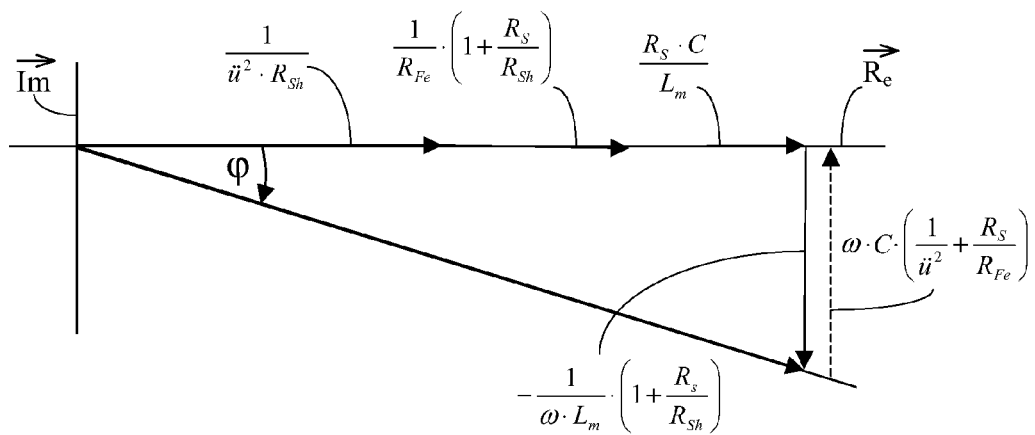
FIG. 2 shows the phasor diagram of the primary current referred to the voltage at the measuring shunt of a toroidal core current transformer with voltage output.

This correlation can also be ascertained from the phasor diagram shown in FIG. 2. The overall capacitance C for the non-compensated current transformer is equal to zero (no capacitance is present yet). Consequently, the phase error $\phi$ between the primary current and the voltage $U_S$ (the secondary current $I_S$ through the measuring shunt is in phase with the voltage $U_S$) is calculated as follows:

$$\tan\varphi = -\frac{\frac{1}{\omega \cdot L_m} \cdot \left(1 + \frac{R_S}{R_{Sh}}\right)}{\frac{1}{\ddot{u}^2 \cdot R_{Sh}} + \frac{1}{R_{Fe}} \cdot \left(1 + \frac{R_S}{R_{Sh}}\right)} \qquad [2]$$

With $\frac{1}{\ddot{u}^2 \cdot R_{Sh}} \gg \frac{1}{R_{Fe}} \cdot \left(1 + \frac{R_S}{R_{Sh}}\right)$ [3]

the following correlation results:

$$\frac{1}{\omega \cdot L_m} = |\tan\varphi| \cdot \frac{1}{\ddot{u}^2 \cdot (R_{Sh} + R_S)} \qquad [4]$$

For a complete compensation, the imaginary component of equation [1] needs to be equal to zero (no phase difference between $I_P$ and $U_S$), i.e., the following must apply:

$$\frac{1}{\omega \cdot L_m} \cdot \left(1 + \frac{R_S}{R_{Sh}}\right) = \omega \cdot C \cdot \left(\frac{1}{\ddot{u}^2} + \frac{R_S}{R_{Fe}}\right) \qquad [5]$$

If equation [4] is now inserted into equation [5] and if it is furthermore taken into account that $$\frac{R_S}{R_{Fe}} \ll \frac{1}{\ddot{u}^2},$$

the following results for the overall capacitance C:

$$C = \frac{|\tan\varphi|}{\omega \cdot R_{Sh}} \qquad [6a]$$

or accordingly in case of the burden $Z_b$:

$$C = \frac{|\tan\varphi|}{\omega \cdot |Z_b|} \qquad [6b]$$

One can ascertain from equation [6a] that, for example, the overall capacitance C needs to be doubled in order to realize the compensation if the value of the measuring shunt $R_{Sh}$ is cut in half. If the overall capacitance C is determined as described above, the phase error $\phi$ can be compensated as indicated with the dotted arrow in FIG. 2.

Figure 3:
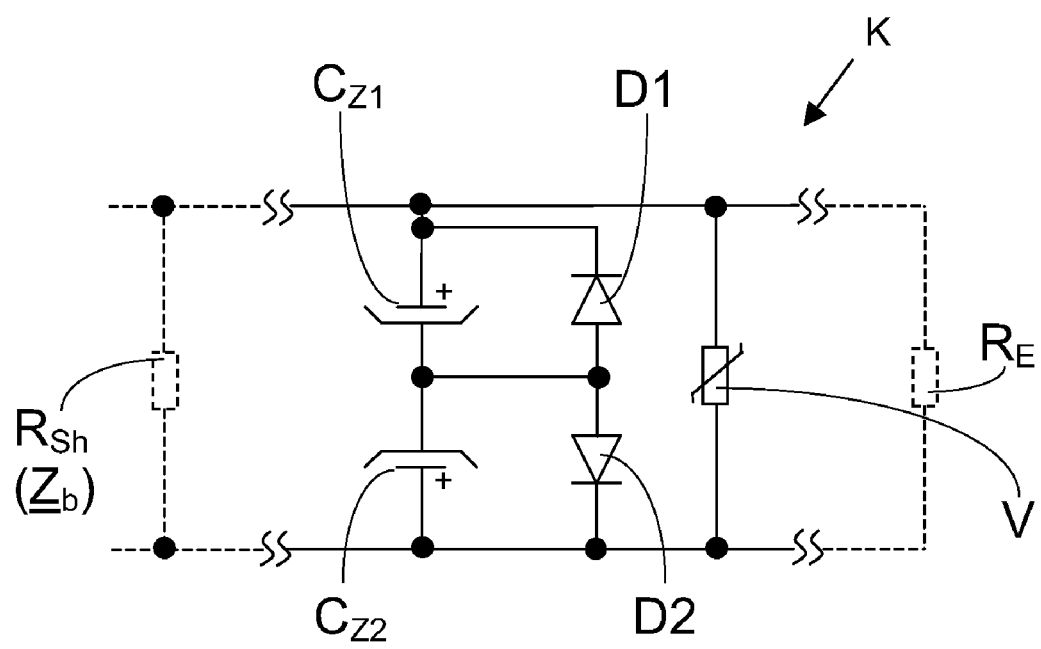
FIG. 3 shows a section of the secondary side of the inventive current transformer with an example of a compensation circuit.

FIG. 3 shows an embodiment of a compensation circuit K that makes it possible to realize the add-on capacitance $C_Z$ that can be connected in order to compensate the phase error. The add-on capacitance $C_Z$ is formed by the two add-on capacitors with the capacitances $C_{Z1}$ and $C_{Z2}$ in this case. If $C_{Z1}$ and $C_{Z2}$ are identical and the series connection of both add-on capacitors forms the add-on capacitance $C_Z$, the add-on capacitance results in $C_Z=C_{Z1}/2=C_{Z1}/2$. If the add-on capacitance $C_Z$ required for the compensation of the phase error $\phi$ needs to be determined, it must be taken into account that the overall capacitance C is calculated in the form of $C=C_Z+C_C$ such that the cable capacitance $C_C$ of any lines needs to be initially subtracted from the overall capacitance C required for the compensation in order to determine the required add-on capacitance $C_Z$. The measuring shunt $R_{Sh}$ or the burden $Z_b$ and the input resistance $R_E$ of the measuring system are respectively illustrated with broken lines in FIG. 3. Since $R_E \gg R_{Sh}$ and $|Z_b|$ respectively applies, the input resistance $R_E$ is not taken into account in determining the capacitance required for the compensation.

The two capacitors of the compensation circuit K with the capacitances $C_{Z1}$ and $C_{Z2}$ are connected in series with opposite polarization. The capacitors illustrated in FIG. 3 consist of electrolyte capacitors, preferably tantalum capacitors. In comparison with conventional metallized paper capacitors, electrolyte capacitors (e.g., wet electrolyte capacitors) in general and, in particular, the aforementioned tantalum capacitors (dry electrolyte capacitors) with the same capacitance have a significantly smaller volume and therefore can be much more easily accommodated in a housing. In addition, these capacitors also provide cost advantages in comparison with metallized paper capacitors. The question whether tantalum capacitors or wet electrolyte capacitors should be used depends, among other things, on the maximum voltage applied to the capacitors. The electric strength of wet electrolyte capacitors is higher (e.g., 500 V for aluminum electrolyte capacitors) than that of tantalum capacitors (which amounts, e.g., to 50 V).

However, electrolyte capacitors are sensitive to incorrect polarization. An incorrectly polarized voltage on electrolyte capacitors which exceeds a certain (comparatively low) value leads to damages or the destruction of the electrolyte capacitors. This is prevented by protecting the capacitors with protective diodes $D_1$ and $D_2$, wherein one protective diode $D_1$ and $D_2$ is connected in parallel to each of the two capacitors that are connected in series. However, the polarization of the respective protective diodes $D_1$ and $D_2$ opposes the polarization of the corresponding capacitor. The conducting-state voltage of the respective protective diodes $D_1$ and $D_2$, i.e., the voltage at which the respective protective diodes $D_1$ and $D_2$ become highly conductive, lies below the highest incorrectly polarized voltage that the electrolyte capacitors can withstand. This means that the respective protective diodes $D_1$ and $D_2$ begin to be highly conductive if an incorrectly polarized voltage occurs, namely before the respective electrolyte capacitor can be damaged or destroyed.

The varistor V (variable resistor, e.g., in accordance with the ZnO technology) connected in parallel to the series circuit of the electrolyte capacitors (and the protective diodes) is a voltage-dependent resistor that represents a short-circuit if a certain voltage is exceeded and protects the compensation circuit and, in particular, the capacitors from occurring overvoltages.

While the aforementioned value of the quantitative error |ϵ| can be adjusted to the required quantitative error with the rating of the measuring shunt $R_{Sh}$ in the toroidal core current transformer with voltage output, the rating of the add-on capacitance $C_Z$ for a toroidal core current transformer with voltage output is described in greater detail below with reference to a numerical example. In this case, the phase error ϕ of the non-compensated current transformer should be measured, wherein this can be realized with a suitable measuring bridge. The cable capacitance $C_C$ depends on the length of the measuring line and is known. The value of the measuring shunt is assumed to amount to $R_{Sh}=1.125$ Ω, wherein it should be taken into account that preferably measuring shunts with a high constancy of temperature, e.g., measuring shunts with a resistance wire of the type ISAOHM® of the firm Isabellenhütte, Dillenburg (Germany), should also be used with respect to the constancy of the quantitative error |ϵ|. The operating frequency in the described example is assumed to be f=50 Hz, i.e., ω=314 s$^{-1}$. The value of the phase error ϕ was determined at ϕ=30' in the preliminary measurement.

According to equation [4] results therefrom for the required overall capacitance C:

$$C = \frac{|\tan\varphi|}{\omega \cdot R_{Sh}} = \frac{\left|\tan\left(\frac{1}{60}\cdot 30\right)\right|}{314\left[\frac{1}{s}\right]\cdot 1.125\left[\frac{V}{A}\right]} = 25\cdot 10^{-6}\frac{As}{V} = 25\mu F$$

If two electrolyte capacitors of identical capacitance are connected in series as illustrated in FIG. 3, the resulting capacitance of the series connection amounts to one-half of the individual capacitances. In a series connection of two capacitors with the respective capacitances $C_{Z1}$ and $C_{Z2}$ of $C_{Z1}=C_{Z2}=47$ μF, the resulting add-on capacitance amounts to $C_Z=23.5$ μF. Due to $$C = \frac{|\tan\varphi|}{\omega \cdot R_{Sh}}$$

with the above-indicated values for C, ω and $R_{Sh}$ (and with the simplification tan ϕ≈ϕ for small angles ϕ), this results in an angle ϕ=0.48°=28.5'. The phase error occurring after the compensation—without taking into account a possible cable capacitance (that typically lies in the range between 5-200 pF/m)—then only amounts to 1.5' (angular minutes).

At a nominal current of $I_P=1.25$ kA, a transfer ratio ü=1: 2500 and a secondary resistance $R_S=12.6$ Ω, an operating voltage of $U_S≈0.5$ V results at the measuring shunt $R_{Sh}$, wherein a voltage of 35 V results at a fully asymmetrical short-circuit current of 25 kA. The capacitors need to be able to withstand this maximum voltage occurring in case of a short-circuit, but this aspect represents no problem for the aforementioned tantalum capacitors as well as wet electrolyte capacitors.

This can also be applied analogously to standard current transformers with a quasi constant impedance $Z_b$ of the burden. Burdens with a positive or negative phase angle are automatically taken into account during the measurement of the phase error ϕ.

It should also be mentioned that toroidal core current transformers with one or more air gaps are particularly advantageous because these air gaps provide a significant contribution to the linearization of the magnetizing characteristic.

The invention claimed is:

1. A method for compensating a phase error between a primary current and a secondary current of a toroidal core current transformer, particularly for medium high-voltage and high-voltage systems, wherein the toroidal core current transformer comprises a primary conductor that traverses the toroidal core, as well as a secondary winding that is wound around the toroidal core and one of a measuring shunt or a burden that is provided on a secondary side, the method comprising the steps of:
   calculating a capacitance of a passive compensation circuit necessary to compensate for the phase error in accordance with the equation $$C = \frac{|\tan\varphi|}{\omega \cdot R_{Sh}} \text{ or } C = \frac{|\tan\varphi|}{\omega \cdot |Z_b|},$$

respectively, wherein

C represents the capacitance of the passive compensation circuit, $\omega$ represents a radian frequency, $\phi$ represents the phase error between the primary and the secondary current, $R_{sh}$ represents the resistance of the measuring shunt and $Z_b$ represents the impedance of the burden, and providing the passive compensation circuit, having the calculated capacitance, on the secondary side in order to compensate for the phase error.

2. The method according to claim 1, wherein the capacitance of the compensation circuit is formed by the sum of the capacitance of a cable and an add-on capacitance, and wherein the capacitance of the cable is subtracted from the capacitance of the compensation circuit in order to determine the add-on capacitance.

3. The method according to claim 1, wherein the compensation circuit used comprises two capacitors that are connected in series with opposite polarization.

4. The method according to claim 3, wherein the two capacitors are tantalum capacitors.

5. The method according to claim 4, wherein a compensation circuit is used in which a protective diode is connected in parallel to each of the two capacitors that are connected in series with opposite polarization, and wherein a polarization of the protective diodes respectively opposes the polarization of the corresponding capacitor.

6. The method according to claim 1, wherein a compensation circuit is used that comprises a varistor as protection against overvoltages.

7. The method according to claim 1, wherein a toroidal core with one or more air gaps is used.

* * * * *